United States Patent [19]
Penney et al.

[11] Patent Number: 6,097,645
[45] Date of Patent: Aug. 1, 2000

[54] HIGH SPEED COLUMN REDUNDANCY SCHEME

[75] Inventors: Daniel B. Penney; Jason M. Brown; Frank Alejano, all of Houston, Tex.

[73] Assignee: Texas Instruments Incorporated, Dallas, Tex.

[21] Appl. No.: 09/261,990

[22] Filed: Mar. 4, 1999

Related U.S. Application Data

[60] Provisional application No. 60/076,807, Mar. 4, 1998.

[51] Int. Cl.[7] ....................................... G11C 7/00
[52] U.S. Cl. ................. 365/200; 365/225.7; 365/230.02; 365/230.06
[58] Field of Search ................................ 365/200, 225.7, 365/230.02, 230.06

[56] References Cited

U.S. PATENT DOCUMENTS

| | | | |
|---|---|---|---|
| 5,548,225 | 8/1996 | Roundtree et al. | 326/13 |
| 5,841,712 | 11/1998 | Wendell et al. | 365/200 |
| 5,896,328 | 4/1999 | Tanizaki et al. | 365/200 |
| 5,959,903 | 9/1999 | Chen et al. | 365/200 |

*Primary Examiner*—Viet Q. Nguyen
*Attorney, Agent, or Firm*—Robby T. Holland; Carlton H. Hoel; Frederick J. Telecky, Jr.

[57] ABSTRACT

A redundancy circuit (300) for generating a standard column access signal (STD) and a redundant column access signal (RED) is disclosed. A modified NOR-type decoder (310) determines if an applied address is the same as a defective address. In the event the applied address is the same as the defective address, a match indication is activated. In the event the applied address is different than the defective address, a no match indication is generated. The match indication activates the RED signal and the no match indication activates the STD signal, according to the timing of a "mimic" circuit (312). The mimic circuit (312) emulates the slowest resolution of the match/no match indication by the modified NOR-type decoder (310).

28 Claims, 3 Drawing Sheets

HIGH SPEED COLUMN REDUNDANCY SCHEME

This application claims priority under 35 USC §119(e)(1) of provisional application No. 60/076,807 filed Mar. 04, 1998.

TECHNICAL FIELD

The present invention relates generally to semiconductor memory devices, and more particularly to redundancy circuits for use in semiconductor memory devices.

BACKGROUND OF THE INVENTION

Semiconductor memory devices typically include one or more memory arrays, each of which includes large number of memory cells arranged in rows and columns. The memory cells are accessed by the application of an address, which results in the selection of a row and a column (or a group of columns). Commonly, memory cells within the same row are coupled to a word line, while memory cells within the same column are coupled to a bit line (or bit line pair). In response to a row address, a given word line will be activated, coupling a row of memory cells to their respective bit line. In response to a column address, selected bit lines are coupled to an input/output (I/O) bus, allowing data to be read from, or written to, the selected memory cells.

While semiconductor device manufacturing processes continue to improve, manufacturing induced defects can still occur. Such defects can arise from uncontrollable process variations or particulate contamination. For the most part, these defects are not catastrophic, and only give rise to a limited number of nonfunctional memory cells within an array. To prevent such relatively small defects from destroying a memory device, it is common practice to employ "redundant" memory cells.

Redundant memory cells are extra memory cells that can be used to replace defective memory cells. In this manner, a device can essentially repair itself by accessing the redundant memory cells instead of the defective memory cells. A redundancy scheme can include row-wise redundancy and/or column-wise redundancy. In the case of row-wise redundancy, one or more extra rows of memory cells are created within the array. In the event an applied memory address corresponds to a row having a defective memory cell, one of the extra rows of memory cells is accessed in place of the row containing the defective memory cell. In the case of column-wise redundancy, the extra columns of memory cells are created within the array. In a memory access operation, the bit line associated with the extra column is coupled to an I/O bus, in place of the bit line of a column having defective memory cells.

To access selected bit lines within a memory cell array, a semiconductor memory device usually includes a column decoding circuit. The column decoding circuit receives the column address, and activates a particular column select signal according to the values of the column address. For example, in the event the column address includes 8-bits, the column decoder would activate one out of $2^8$ column select signals. The speed at which the column decoder can select a given column address (i.e., decode the address) can play an important role in the overall speed of the device.

When column redundancy schemes are employed, the semiconductor memory device must incorporate column redundancy circuits into the column decoding scheme. A common circuit item for such redundancy schemes is a redundancy decoder circuit for comparing the incoming column address with a known bad address (address of a column having a defective cell or cells). If a match occurs, the semiconductor memory device accesses a redundant column instead of the known bad column. The location of a defective column address is determined by testing the device after it has been manufactured, and then programming defective address location(s), often by way of fusible links or like, into the decoder circuit.

Figure 1:
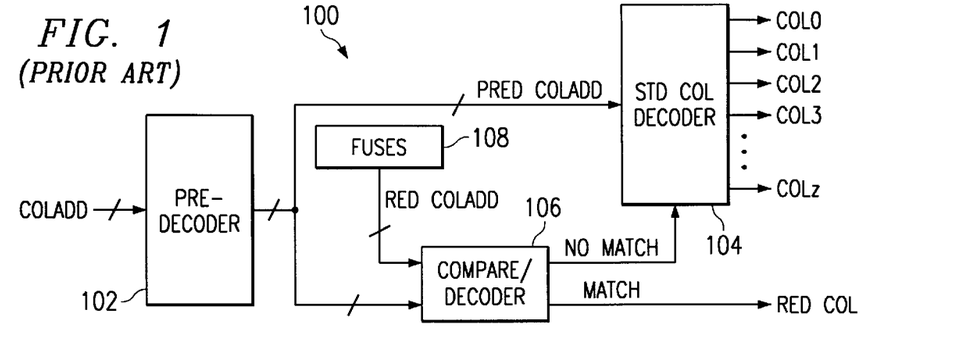
FIG. 1 is a block schematic diagram illustrating a column decoding arrangement of the prior art.

Referring now to FIG. 1, a prior art redundancy scheme is set forth in schematic block diagram. The block diagram is designated by the general reference character 100 and is shown to include a pre-decoder circuit 102 that receives a column address. The pre-decoder circuit 102 provides an initial level of decoding to generate "column factors." Such pre-decoding typically consists of an initial set of logic gates to combine groups of address bits with one another. The output of the pre-decoder circuit 102 is shown in FIG. 1 as "PRED COLADD." It is noted that the number of PRED COLADD values is greater than the number of COLADD values.

The PRED COLADD signals are applied to a standard column decoder 104 and a compare/decoder circuit 106. In addition to the PRED COLADD signals, the compare/decoder circuit 106 also receives a pre-decoded defective column address RED COLADD. The RED COLADD address is provided by a fuse circuit 108. The fuse circuit 108 includes a fusible link corresponding to each RED COLADD signal. In order to generate the RED COLADD signal, selected of the fusible links within the fuse circuit 110 are either opened, or kept intact, to establish the logic of the RED COLADD signals.

When the RED COLADD signals do not match the PRED COLADD signals, a "no match" signal is activated which enables the standard column decoder 104. The standard column decoder 104 will then activate a standard column select signal (COL0–COLz) corresponding to the PRED COLADD signal. In contrast, when the RED COLADD signals match the PRED COLADD signals, a "match" signal is activated. The match signal serves as a redundant column enable signal RED COL.

A drawback to the prior art redundancy scheme of FIG. 1 is the large number of fuses required to generate the pre-decoded defective column address RED COLADD. As noted above, the number of signals required to generate a pre-decoded address is greater than the number of address signals. Further, each fuse can consume significant space on the memory device. For example, a laser fusible link may require a minimum spacing from other device structures due to the spot size of the laser, and/or require a relatively large area oxide window over the fusible link. Such requirements add to the size of the semiconductor memory device.

In addition, the current fusible links and/or "anti-fuse" structures may require additional circuits to ensure that appropriate current and/or voltage signals are applied to the fusible link. Such additional circuits also add to the size of the semiconductor device. Further, anti-fuse structures can require specialized processing steps. Therefore, the implementation of FIG. 1 can require considerable area or additional process steps to implement.

A further drawback to the redundancy arrangement of FIG. 1 is the timing requirements necessary to ensure proper operation. In the event the "no match" and "match" signals are activated close together in time, the simultaneous activation of a standard column select signal (COL0–COLz) can occur, resulting in an erroneous operation (glitch).

One way to reduce the number of fuses required to implement a redundancy scheme is to compare/decode the applied undecoded address. An example of a NOR-type decoding arrangement is set forth in FIG. 2 in a detailed schematic diagram. The NOR-type decoder 200 receives the results of a bit-by-bit comparison between the defective column address (RED COLADD0–RED COLADDn) and the applied column address (COLADD0–COLADDn). In the particular example of FIG. 2 the comparison is equivalent to a XOR function. Each bit-by-bit comparison is applied to the gate of a pull-down transistor (N200–N20n) having a source-drain path coupled between the low power supply voltage VSS, and a pre-charge node 202. The pre-charge node 202 is precharged to the high power supply voltage VCC by a pre-charge signal PRECH_. The pre-charge operation is accomplished by a pre-charge transistor P200 having a gate which receives the PRECH_ signal and a source-drain path coupled between the pre-charge node 202 and the high power supply voltage.

Figure 2:
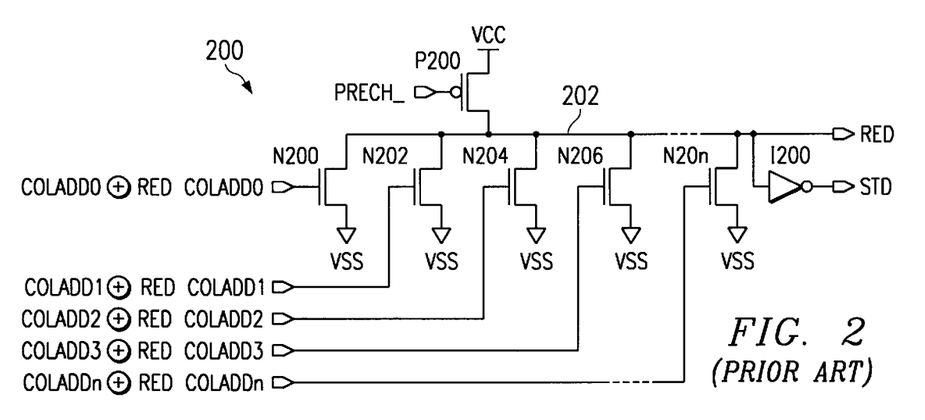
FIG. 2 is a detailed schematic diagram illustrating a NOR-type redundant column decoding circuit of the prior art.

In operation, the PRECH_ signal is initially low, pulling the pre-charge node 202 high. Subsequently, a column address (COLADD0–COLADDn) is applied and compared on a bit-by-bit basis with the fuse programmed defective address (RED COLADD0–RED COLADDn). The resulting bit comparisons are applied to the gates of transistors N200–N20n. In the event the applied address is different from the defective address, at least one of the bit-by-bit comparisons will be high, and activate its associated pull-down transistor. The pre-charge node 202 will be pulled low, and inverter 1200 will generate a high standard access signal STD. The high STD signal enables the standard (i.e., non-redundant) column select devices within the memory device. In the event the applied address is the same as the defective address, all of the bit-by-bit comparisons will be low, and none of the pull-down transistors (N200–N20n) will be turned on. The pre-charge node 202 will remain high and produce a high redundant enable signal RED. The RED signal, in combination with other timing signals, will activate a redundant column.

While the redundancy arrangement illustrated in FIG. 2 requires fewer fuses to implement, the NOR-type decoder can produce disparities in timing according to the values of the bit comparisons. There may also be differences in timing between the standard accesses and redundant accesses. For example, there may be a particularly "fast" standard access in which nearly all of the bit-by-bit comparisons are high. As a result nearly all of the pull-down transistors (N200–N20n) are on, providing for rapid discharge of the pre-charge node 202. Conversely, a standard case may result in a relatively "slow" timing, when all but one of the bit-by-bit comparison signals are low. In such a case, only one of the pull-down transistors (N200–N20n) will be turned on, requiring more time to discharge the pre-charge node 202. Finally, because no discharge operation is required, the RED signal is already high, and the redundant access may be accomplished faster than any of the standard accesses.

It would be desirable to provide a redundant column decoder that does not require considerable area for fusible link structures. Further, it would also be desirable to provide a redundant column decoder that does not suffer from timing disparities between standard column accesses and redundant column accesses.

SUMMARY OF THE INVENTION

According to the preferred embodiment, a column decoder includes a modified NOR-type decoder for determining if an applied column address is the same as the address of a defective column (a match condition) or different than the address of a defective column (a no match condition). An interlock circuit receives the match/no match information and generates either a redundant column enable signal (RED) or standard column enable signal (STD). The timing of both the RED and STD signals is controlled by a "mimic" circuit, which emulates the slowest resolution of the match/no match indication by the modified NOR-type decoder. In this manner, uniform timing is achieved by forcing the RED or STD signals to be activated according to the slowest match/no match resolution timing.

According to one aspect of the preferred embodiment, the modified NOR-type decoder circuit includes a number of compare transistors arranged in parallel. The slowest resolution of the match/no match determination occurs when only one of the compare transistors is turned on. The mimic circuit emulates the slowest resolution case by including a transistor having the same characteristics as the compare transistors that is turned on, mimicking a single activated compare transistor. The mimic circuit further includes a second larger transistor that is turned off, mimicking the number of de-activated compare transistors.

According to another aspect of the preferred embodiment, the column decoder circuit includes a fuse/compare circuit for storing a defective column address by opening selected fusible links. The fuse/compare circuit includes a fusible link corresponding to each bit of the column address, providing for a relatively small number of fusible links.

An advantage of the preferred embodiment is that it utilizes a NOR-type decoder, and as a result, standard column access operation will "lock out" a redundant column access, providing greater immunity from glitches (that result when both a redundant and standard column are accessed simultaneously).

DETAILED DESCRIPTION OF THE EMBODIMENTS

The preferred embodiment is a column redundancy circuit that can be used in a synchronous dynamic random access memory (SDRAM). The redundancy circuit receives general timing signals, CRAS and YPULSE, which indicates a column access operation. In response to the timing signals and an applied address, the column redundancy circuit provides two signals, a redundancy enable signal RED and a standard enable signal STD. The RED signal activates the column select circuits for a given redundant column. The STD signal enables the select circuits for standard column enable signals. The preferred embodiment utilizes the comparison of the undecoded address with a stored defective address to determine whether the operation is a redundant access (RED high) or a standard access (STD high). A defective address is stored within the circuit by fusible links, one for each column address bit, providing for a relatively compact fuse arrangement.

The preferred embodiment utilizes a novel variation of a NOR-type redundant decoder that does not suffer from the disparities in timing associated with conventional NOR-type decoders. The improved timing response of the preferred embodiment is accomplished by employing a "mimic" circuit that emulates the delay of the slowest operation of the modified NOR-type decoder. The resulting output of the mimic circuit is used to enable both the redundant enable signal RED and the standard enable signal STD, providing a relatively uniform response regardless of the type of access or particular address. That is, both redundant and standard accesses have the same general response, and the general timing results whether one pull-down transistor is turned on or many pull-down transistors are turned on in a NOR-type decoder.

The preferred embodiment is fabricated with complementary metal-oxide(insulator)-semiconductor (CMOS) technology, and so may be advantageously implemented in existing semiconductor device fabrication processes. Further, the preferred embodiment benefits from the low power characteristics of CMOS technology.

Figure 3A:
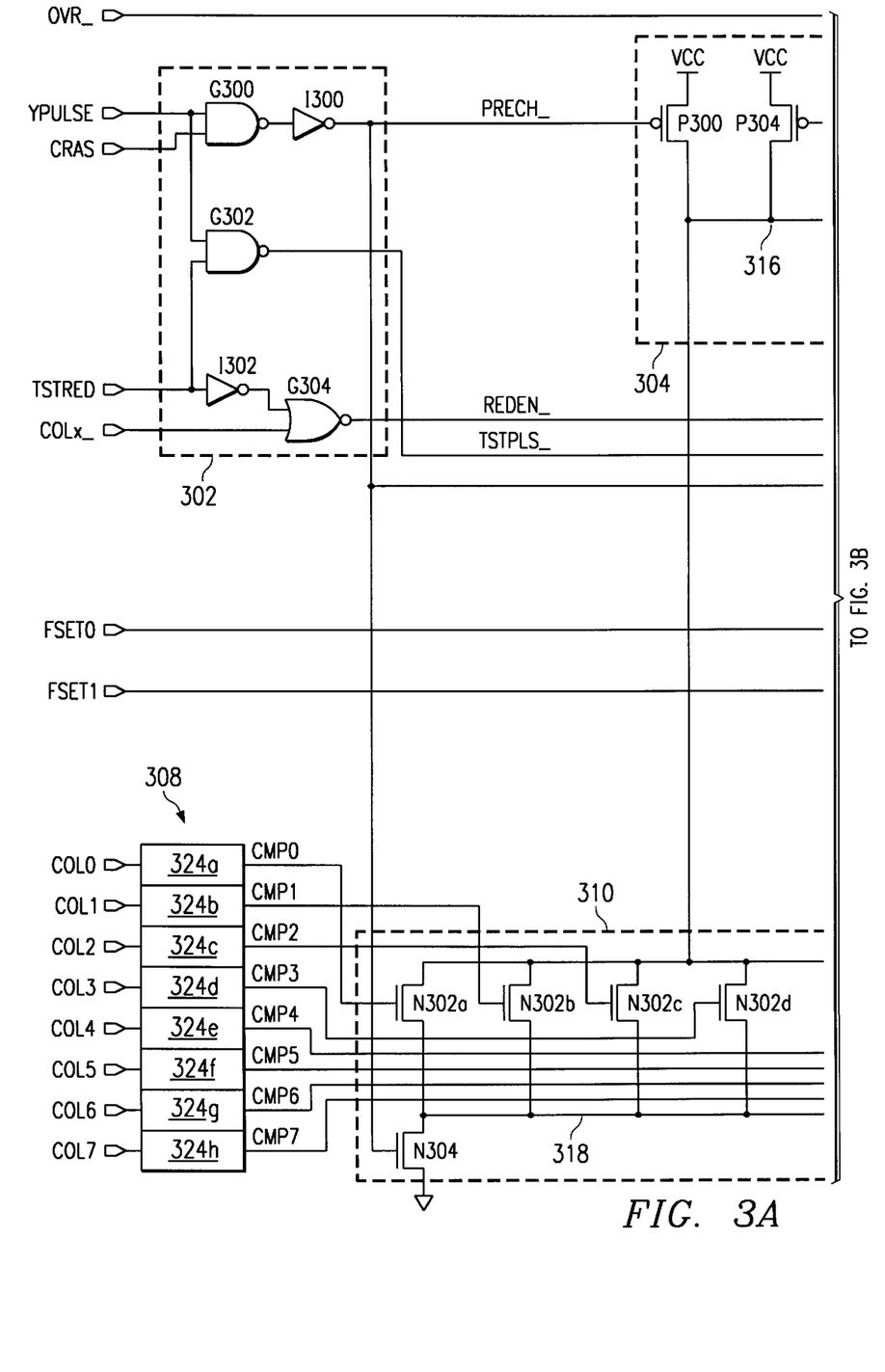
FIG. 3 is a detailed schematic diagram of the preferred embodiment.
Figure 3B:
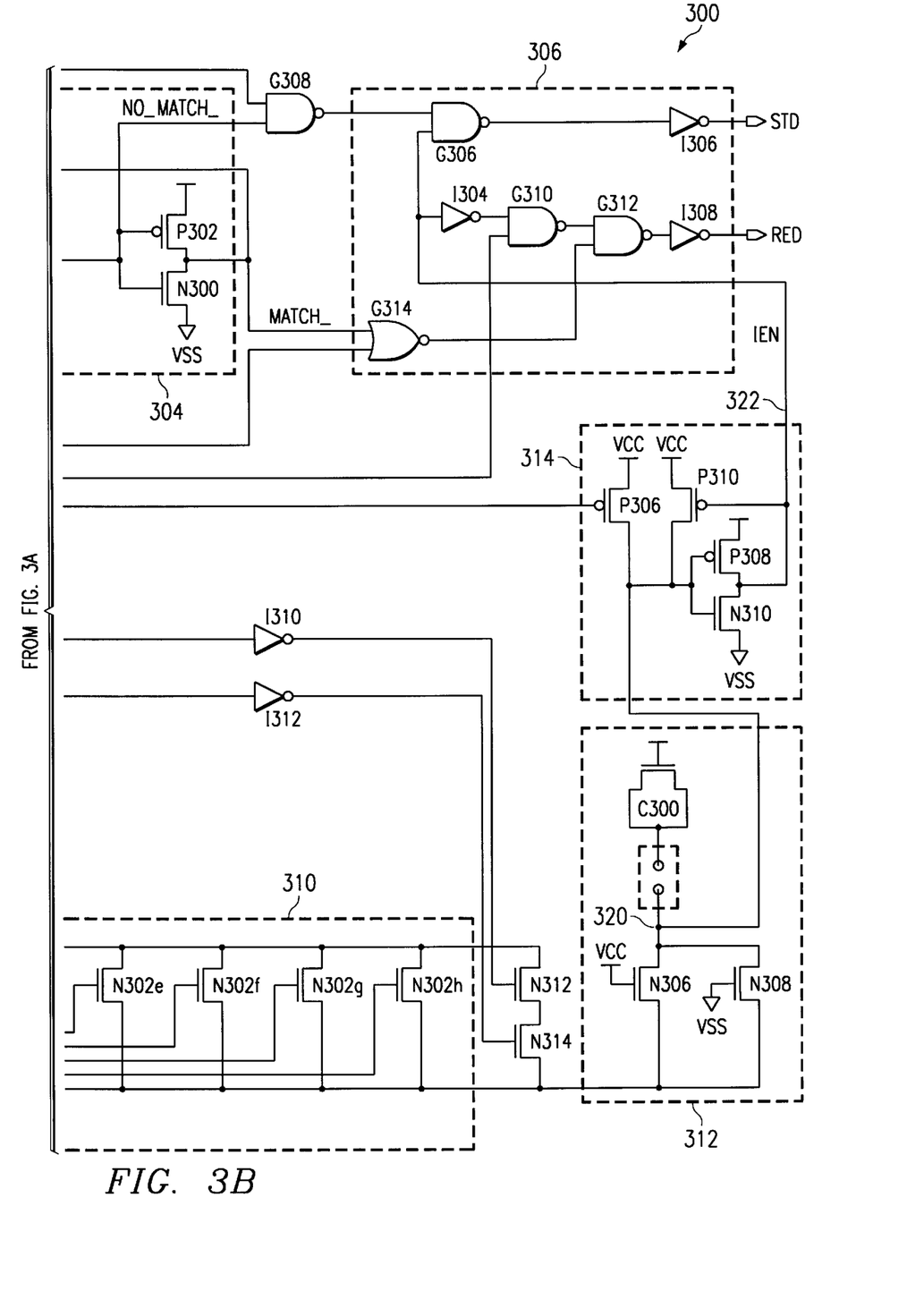

The preferred embodiment is set forth generally in a detailed schematic diagram in FIG. 3, and designated by the general reference character 300. The preferred embodiment includes a control logic circuit 302, a match indicate circuit 304, and an interlock circuit 306. The preferred embodiment 300 further includes a fuse/compare circuit 308, a modified NOR-type decoder 310, a mimic circuit 312, and an interlock control circuit 314.

The general operation of the preferred embodiment 300 can be conceptualized as follows. The preferred embodiment 300 receives the CRAS and YPULSE timing signals at the control logic circuit 302. The control logic circuit 302 also receives control signals to indicate the particular modes of operation in which various portions of the preferred embodiment may be disabled. Assuming that the control signals indicate a normal mode of operation, the CRAS and YPULSE timing signals are initially in an inactive state. In response to the inactive CRAS and YPULSE signals, the control logic circuit 302 will initially precharge the match indicate circuit 304 to a "match" state. In an active operation (e.g., a read or write operation) the match indicate circuit 304 will either remain in the match state, indicating an applied address is a defective address (and hence a redundant column must be accessed), or it will switch to a "no match" state, indicating an applied address is a "good" address (and hence a standard column must be accessed).

The control logic circuit 302 also pre-charges the interlock control circuit 314 to a disable state. In the disable state, the interlock control circuit 314 disables the interlock circuit 306. When disabled, the interlock circuit 306 prevents both the RED signal and STD signal from being active (high). Once the match indicate circuit 304 and interlock control circuit 314 are pre-charged by the control circuit 302, an active operation can be initiated by a logic transition in the CRAS and YPULSE signals. In an active operation, a column address (COL0–COL7) is received at the fuse compare circuit 308 and compared on a bit-by-bit basis with a programmed defective column address. The results of the address comparison generate comparison values (CMP0–CMP7) which are coupled to the modified NOR-type decoder 310. The modified NOR-type decoder 310 is enabled by the CRAS signal, and in the event the comparison values (CMP0–CMP7) indicate a match between the defective address and the applied address (COL0–COL7), the match indicate circuit 304 remains in the match state, providing a match indication to the interlock circuit 306. If, however, the comparison values (CMP0–CMP7) indicate a no-match condition, the modified NOR-type decoder 310 will discharge the match indicate circuit 304 to a "no match" state, resulting in a no match indication being provided to the interlock circuit 306.

The active operation also discharges the interlock control circuit 314 from the disable state to an enable state. The discharging of the interlock control circuit 314 is not immediate, however, and instead occurs by way of the mimic circuit 312. The mimic circuit 312, in combination with the interlock control circuit 314, essentially mimics the slowest resolution of the "match" or "no match" condition by the modified NOR-type decoder 310 and match indication circuit 304. In this manner, the interlock circuit 306 is uniformly enabled according to the timing established by the mimic circuit 312, regardless of whether the active operation is a redundant column access or standard column access, and regardless of whether one, or all of the compare signals (CMP0–CMP7) indicates a no match condition. Once enabled, the interlock circuit 314 allows the previously established state of the match indication circuit 304 to drive the RED signal (in the case of a match state) or the STD signal (in the case of a no match state) high.

Having described the general operation of the preferred embodiment 300, a detailed description of the various circuits therein will be discussed. Referring once again to FIG. 3, the control circuit 302 is shown to receive a CRAS signal, a YPULSE signal, a TSTRED signal, and a higher order address bit COLx. The CRAS signal indicates an active cycle by transitioning from a low logic state to a high logic state. The YPULSE signal determines the pulse width of the RED and STD signals.

The TSTRED signal and COLx_ bit are enabled in a special test mode, and allow the redundant column to be accessed without the decoding circuitry. In this manner, the redundant column may be tested to ensure that it does not have any defects, and so may be used to replace a standard column.

The YPULSE signal and CRAS signal are provided as inputs to a two-input NAND gate G300. The output of gate G300 is inverted by an inverter, shown as I300, to generate a pre-charge signal shown as PRECH_. The PRECH_ signal is coupled to the match indication circuit 304, the interlock control circuit 314, and the modified NOR-type decoder 310. When the PRECH_ signal is low, the match indication circuit 304 and interlock control circuit 314 are pre-charged to the match and disable states, respectively. When the PRECH_ signal is high, it enables the modified NOR-type decoder circuit 310. Thus, provided the CRAS signal is high, the PRECH_ signal will follow the YSPULSE signal. However, in the event the CRAS signal is low, the preferred embodiment 300 is maintained in the initial pre-charged state, and transitions in the YPULSE signal will not affect the PRECH_ signal.

The control circuit 302 of the preferred embodiment 300 further includes a two-input AND gate G302 that receives the YPULSE signal and TSTRED signal as inputs. The output of gate G302 is shown as TSTPLS_, and serves one of two functions, depending upon the operating mode of the preferred embodiment 300. In a normal operating mode, the TSTRED signal is low, forcing the TSTPLS_ signal high and enabling the RED signal path within the interlock circuit 306. In a test mode, the TSTRED signal is high, forcing TSTPLS_ low, which overrides the other timing signals in the interlock circuit 306, and drives the RED signal high (active). In this manner, the redundant column can be accessed to test the bits therein.

Continuing on with the description of the control circuit 302, as shown in FIG. 3, the TSTRED signal is also inverted by inverter I302 to provide one input to a two-input NOR gate G304. The other input to gate G304 is the COLx_ bit. The output of gate G304 is shown to provide a redundant path enable signal REDEN_. In a normal mode of operation, the TSTRED signal is low, forcing the REDEN_ signal low. A low REDEN_ signal also enables the RED signal path within the interlock circuit 306. In a test mode of operation, the TSTRED signal will be high, providing one low input to gate G304. With the TSTRED signal high, the REDEN_ signal will only be low if the COLx_ bit is high. In this manner, the COLx_ bit is used to select a particular redundant column for testing in the test mode.

Referring again to FIG. 3, the match indication circuit 304 of the preferred embodiment 300 is shown to include a p-channel pull-up transistor P300, having a source-drain path coupled between the high power supply VCC and a match precharge node 316. The gate of transistor P300 receives the PRECH_ signal from the control circuit 302. The match indication circuit 304 further includes a feedback inverter formed by a p-channel MOS transistor P302 and an n-channel MOS transistor N300, and a p-channel feedback transistor P304. The input to inverter P302/N300 is coupled to the match precharge node 316. The output of inverter P302/N300 provides an active low match indication signal MATCH_ to the interlock circuit 306. The source-drain path of transistor P304 is coupled between the match pre-charge node 316 and the high power supply voltage VCC. The gate of transistor P304 receives the MATCH_ signal. An active low NO_MATCH_ signal is also provided at the match pre-charge node 316 to the interlock circuit 306.

In operation, with PRECH_ initially low, transistor P300 is turned on, pulling the match pre-charge node 316 to the high power supply voltage VCC. The NO_MATCH_ signal is thus high, and inverter P302/N300 drives the MATCH_ signal low. Transistor P304 is also turned on, latching the match pre-charge node 316 high. As noted previously, in the event of a match condition (defective column accessed), the match indication node 316 is maintained in its pre-charged state, providing a low MATCH_ signal and high NO_MATCH_ signal.

In the event of a no match condition (standard column accessed), the match pre-charged node 316 is pulled low by the modified NOR-type decoder. The NO_MATCH_ signal begins to go low, and the output of inverter P302/N300 goes high, resulting in a high MATCH_ signal and transistor P304 being turned off. In this manner, a standard access operation results in a low NO_MATCH_ signal and high MATCH_ signal being applied to the interlock circuit 306. The determination of the match/no match condition can be conceptualized as depending upon having the voltage at the match indication node 316 varying from a pre-determined threshold voltage established by inverter P302/N300. Once the potential at the match indication node 316 falls below the threshold voltage of inverter P302/N300, the match indication will flip to a no match indication.

The use of the p-channel transistor P300 allows for rapid pre-charging of the match indication node 316. Further, transistor P304 in combination with the inverter P302/N300 allows a match indication node 316 be maintained (i.e., latched) in the pre-charge state.

The modified NOR-type circuit 310 of the preferred embodiment 300 is shown to include eight n-channel compare transistors (N302a–N302h) arranged in parallel between the match pre-charge node 316 and a common discharge node 318. Each compare transistor (N302a–N302h) receives one of the compare signals (CMP0–CMP7) at its gate. The common discharge node 318 is coupled to the low power supply voltage VSS by n-channel discharge transistor N304. The discharge transistor N304 receives the PRECH_ signal at its gate. In the preferred embodiment 300, the discharge transistor N304 is larger than the compare transistors (N302a–N302h), the ratio between the widths of the individual compare transistors and the discharge transistor being 3:20.

In operation, when the PRECH_ signal is initially low, discharge transistor N304 is turned off, isolating the common discharge node 318 from the low power supply voltage. During an active operation, the PRECH_ signal is driven high, and discharge transistor N304 is turned on, pulling the common discharge node 318 to the low power supply voltage VSS. In the event there is a match condition (the applied column address is the same as the programmed defective address) all of the compare signals (CMP0–CMP7) will be low, turning off the compare transistors (N302a–N302h). With compare transistors N302a–N302h all turned off, the match pre-charge node 316 is isolated from the common discharge node 318 and remains high. In contrast, in the event there is a no match condition, as few as one, or as many as all of the compare signal (CMP0–CMP7) will be high, turning on at least one of the compare transistors (N302a–N302h). With at least one of the compare transistors N302a–N302h turned on, the match pre-charge node 316 is discharged to the low power supply voltage VSS by way of common discharge node 318.

The modified NOR-type decoder 310 circuit advantageously reduces the generation of glitches caused by simultaneous selection of a standard and redundant column. In the event a standard column is selected, the match indication node 316 is discharged, driving the NO_MATCH_ signal low and the MATCH_ signal high. In this manner, a match indication will lock out a no match indication. The modified NOR-type decoder 310 will discharge the match indication node 316 at varying rates according to the number of compare transistors (N302a–N302h) that are turned on. In the preferred embodiment 300 there is a one-to-one relationship between the number of compare transistors and undecoded column address bits, allowing for a relatively compact circuit arrangement.

The mimic circuit 312 of the preferred embodiment 300 is shown to include two n-channel MOS transistors N306 and N308 arranged in parallel between an active discharge node 320 and the common discharge node 318. Transistor N306 has a gate coupled to the high power supply voltage VCC, and so is always in an "on" state. In contrast, transistor N308 has a gate coupled to the low power supply voltage VSS, and so is always off. Transistor N308 is larger than transistor N306, the width ratio between the two transistors being 15:3. In this manner, the mimic circuit 312 emulates the response of the modified NOR-type decoder circuit 310. The slowest match/no match determination in the modified NOR-type decoder circuit 310 occurs when all but one of the compare transistors (N302a–N302h) is turned off. In this situation, the single enabled compare transistor must discharge the match pre-charge node 316. In the case of the mimic circuit 312, transistor N306 discharges the active discharge node 320, emulating a single turned on compare transistor, while relatively large transistor N309 remains off, emulating the large number of turned off compare transistors. Transistors N306 and N308 can be considered mimic devices, as they mimic the operation of devices within the modified NOR-type decoder 310. Transistor N306 is a mimic "on" transistor, as it mimics a turned on compare transistor. Similarly, transistor N308 is a mimic "off" transistor, as it mimics the turned off compare transistors. The preferred embodiment 300 mimic circuit 312 is shown to further include an optional capacitor C300 for increasing the amount of delay introduced by the mimic circuit 312. Such a capacitor may be employed in the event the capacitance of the active discharge node 320 is relatively smaller than that of the match pre-charge node 316. In the preferred embodiment 300, capacitor C300 may be connected during the fabrication of the device by way of a "metal option."

In operation, the active discharge node 320 is pre-charged high. As noted above, when the device undergoes an active operation, the y-pulse signal goes high, resulting in a high PRECH_ signal. Transistor N304 within the modified NOR-type decoder 310 turns on, pulling the common discharge node 318 to the low power supply voltage VSS. When transistor N304 is turned on, the active discharge node 320 begins to discharge through transistor N306.

The use of the same transistor N304 to enable a discharge path for both the modified NOR-type decoder 310 and mimic circuit 312 further matches the response of the mimic circuit 312 to the worst case no match resolution of the modified NOR-type decoder 310. Along these lines, an alternate way of conceptualizing the preferred embodiment would be to consider the common sources of the compare transistors (N302a–N302h) forming a first common node, and the common sources of the mimic transistors (N306 and N308) forming a second common node, the first and second common nodes being coupled together and commonly discharged by the a timing signal (CRAS and YPULSE).

The operation of the preferred embodiment 300 may also be conceptualized in terms of delays. The modified NOR-type decoder 310 introduced a match determination delay caused by the discharge of the match indication node 316. A worst case match determination delay results when only one of the compare transistors is turned on. The mimic circuit 312 emulates the worst case match determination delay with a mimic delay. By having all accesses (redundant or standard) based on the worst case determination delay, the preferred embodiment 300 provides uniform timing, while ensuring the worst case timing (worst case match determination) is accounted for.

Referring once again to FIG. 3, the interlock control circuit 314 of the preferred embodiment 300 is shown to have the same general configuration as the match indication circuit 304. The interlock control circuit 314 includes a p-channel pull-up transistor P306, having a source-drain path coupled between the high power supply VCC and the active discharge node 320. The gate of transistor P306, like that of transistor P300 within the match indication circuit 304, receives the PRECH_ signal from the control circuit 302. A feedback inverter formed by a p-channel transistor P308 and an n-channel MOS transistor N310, and a p-channel feedback transistor P310. The input to inverter P308/N310 is coupled to the active discharge node 320. The output of inverter P308/N310 provides an active high interlock enable signal IEN to the interlock circuit 306. The source-drain path of transistor P310 is coupled between the active discharge node 320 and the high power supply voltage VCC. The gate of transistor P310 receives the IEN signal.

In operation, the PRECH_ signal is initially low. Transistor P306 is turned on, pulling the active discharge node 320 to the high power supply voltage VCC. Inverter P308/N310 thus drives the IEN signal low. Transistor P310 is also turned on, latching the active discharge node 320 high. As noted in conjunction with the description the mimic circuit 312, in an active operation, the mimic circuit 312 will discharge the active discharge node 320 in a simulation of a worst case modified NOR-type decoder 310 operation. When the active discharge node 320 goes low, the output of inverter P308/N310 begins to go high, generating an active (IEN) interlock enable signal, and turning off transistor P310. In this manner, in an active operation, a high IEN signal is applied to the interlock circuit 306.

Because the preferred embodiment interlock control circuit 314 has the same general configuration as the match indication circuit 304, it has the same rapid pre-charge and latching advantages previously described.

The interlock circuit 306 of the preferred embodiment 300 is shown to include a two-input NAND gate G306 and an inverter I304, both of which receive the IEN signal from the interlock enable circuit. Gate G306 receives as a second input, the NO_MATCH_ signal by way of a NAND gate G308. The output of gate G306 is inverted by an inverter I306 to generate the STD signal. Gate G306 and inverter I306 thus form a STD signal path within the interlock circuit 306. Because the STD signal indicates a no match condition, the output of inverter I306 can be considered a "no match" output.

In operation, the initial pre-charge operation within the match indication circuit 304 and the interlock control circuit 314 result in both inputs to gate G306 being low. The output of G306 is thus high, and inverter I306 provides a low STD signal. In an active operation, in the case of a no match condition, the input from the match indication circuit 304 will go high. Subsequently, the IEN signal will also go high, enabling gate G306 to produce a low output. Inverter I306 will drive the STD signal high in response. In the case of a match condition, the input to gate G306 from the match indication circuit 304 will remain low, and thus maintain the STD signal in the low state.

As set forth in FIG. 3, the output of inverter I304 is provided as one input to a two-input NAND gate G310. The other input to gate G310 is the TSTPLS_ signal, previously described in conjunction with the description of the control circuit 302. The output of gate G310 is provided as one input to another two-input NAND gate G312. The other input to gate G312 is provided by a two-input NOR gate G314 which receives the MATCH_ signal and REDEN_ signal as inputs. The output of gate G312 is inverted by an inverter I308 to generate the RED signal. Thus, the combination of gates G310, G312, G314 and inverters I304 and I308 form a RED signal path within the interlock circuit 306. Because the STD signal indicates a no match condition, the output of inverter I306 can be considered a "match" output.

In a normal operation, the REDEN_ signal is low and the TSTPLS_ signal is high. The initial pre-charge operation within the match indication circuit 304 and the interlock control circuit 314 results in the MATCH_ signal and the IEN signal being low. With the IEN signal low, both inputs to gate G310 are high, producing a low input to gate G312. The output of gate G312 is high, in response, creating a low RED signal. In an active operation, in the case of a no match condition, the MATCH_ signal will go high, and the output of gate G314 will go low. The low gate G314 output disables gate G312, resulting in the low STD signal state being maintained. In contrast, in the case of a match condition, the MATCH_ signal will remain low, and maintain gate G312 in the enabled state. Subsequently, the IEN signal will transition from low to high. This transition in logic propagates through gates G310, G312 and inverter I308 to generate a high RED signal.

It is noted that in the preferred embodiment interlock circuit 306, the NO_MATCH_ indication is gated to the no match output (output of inverter I306) by gate G306. Gate G306 is enabled by the IEN signal. Gate G306 can thus be considered a "no match" interlock gate. Similarly, the MATCH_ indication is gated to the match output (output of inverter I308) by gate G312. Gate G312 is enabled by the IEN signal (via inverter I304 and gate G310). Thus, gate G312 can be considered a "match" interlock gate. The common enabling of the match and no match interlock gates provides the advantages of uniform timing of the preferred embodiment 300.

It is noted that the NO_MATCH signal is coupled to the interlock circuit 306 by NAND gate G308. The gate G308, in turn, is enabled by a redundancy override signal, shown as OVR_. Thus, provided the OVR_ signal is high, the NO_MATCH_ signal will be capable of disabling the STD signal in the case of a match condition. However, in the event the OVR_ signal is low, the match/no match determination will have no effect on the STD signal, allowing the STD signal to go high in an active operation. This arrangement is used in conjunction with built in test (design-for-test) circuits within the memory device where the STD signal may be used to access more than one (or more than one set) of columns.

The preferred embodiment column redundancy circuit 300 may be utilized with two sets of redundant fuses. In the event a first of the fuse sets is utilized, an FSET0 signal will be high. Similarly, of the second fuse set is utilized, an FSET1 signal will be high. In the event neither of the fuse sets is utilized (no redundancy), both the FSET0 and FSET1 signals will be low. The FSET0 and FSET1 signals are received by inverters I310 and I312, respectively. The output of inverter I310 is coupled to the gate of transistors N312. The output of inverter I312 is coupled to the gate of transistor N314. Accordingly, in the event both the FSET0 and FSET1 signal are low, transistors N312 and N314 will be turned on, coupling the match pre-charge node 316 to the common discharge node 318, and disabling the modified NOR-type decoder circuit 310. If however, either the FSET0 or FSET1 signal is high, one of the transistors N312 or N314 will be turned off, enabling the NOR-type decoder circuit 310.

The fuse compare circuit 308 of the preferred embodiment 300 is shown to include a bit fuse/compare circuit (324a–324h) corresponding to each received address bit (COL0–COL7). Each bit fuse/compare circuit (324a–324h) includes one fuse bit of a programmed defective address, and compares the fuse bit with its respective column address bit (324a–324h) to generate one of the compare signals (CMP0–CMP7). The received address bits are undecoded, and so represent the smallest number of signals that can be used to identify an address (as opposed to predecoded signals).

Figure 4:
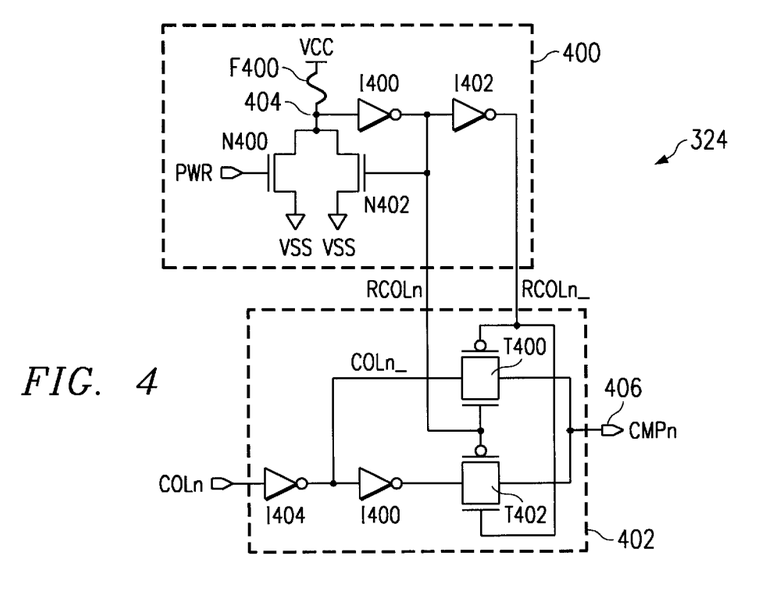
FIG. 4 is a detailed schematic diagram illustrating programmable address and compare circuits of the preferred embodiment.

Referring now to FIG. 4, a bit fuse/compare circuit that may be used in the preferred embodiment 300 is set forth in a detailed schematic diagram. The bit fuse/compare circuit is designated by the general reference character 324, and shown to include fuse section 400 and a compare section 402. The fuse section 400 is programmable to provide two complementary signals, RCOLn and RCOLn_. The fuse section 400 is shown to include a fusible link F400 coupled between the high power supply voltage VCC and a fuse node 404. Two n-channel transistors (N400 and N402) are disposed in parallel between the fuse node 404 and the low power supply voltage VSS. Transistor N400 receives a power-up signal PWR at its gate. The fuse node 404 is coupled to the gate of transistor N402 by way of inverter I400. The output of inverter I400 provides the RCOLn signal, and further provides an input to a second inverter I402. The output of the second inverter I402 provides the RCOLn_ signal.

The compare section 402 receives the RCOLn and RCOLn_ signals from the fuse section 400 in addition to one column address bit, shown as COLn. The COLn signal is received by an inverter I404, which generates an inverse column bit signal COLn_. The output of inverter I404 is inverted once again by inverter I406 to provide a buffered COLn signal. The COLn_ signal is coupled to an output node 406 by a CMOS transmission gate T400. In the same fashion, the COLn signal is coupled to the output node 406 by a second CMOS transmission gate T402. The output node 406 provides the compare signal (shown as CMPn) signal for the bit fuse/compare circuit 324. The n-channel device of transmission gate T400 and p-channel device of transmission gate T402 receive the RCOLn signal. The p-channel device of transmission gate T400 and n-channel device of transmission gate T402 receive the RCOLn_ signal.

In operation, assuming the address of a defective column is known, the fusible link F400 is either kept intact or opened. If the defective address bit corresponding to the column address COLn bit is low, the fusible link F400 is kept intact. With fusible link F400 intact, the fuse node 404 will be pulled high, and the RCOLn signal will be driven low by inverter I400. The low RCOLn signal turns off transistor N402, and results in a high RCOLn_ signal. If the defective address bit is high, the fusible link F400 is opened. When the device is powered-up, the PWR signal will go high, turning on transistor N400, and pulling the fuse node 404 low. Because the fusible link F400 is opened, the fuse node 404 will remain low. Inverters I400 and I402 receive the low voltage at node 404 and generate a high RCOLn signal and low RCOLn_ signal.

In response to the values of the RCOLn and RCOLn_ signals, the compare section 402 couples either the COLn value or its inverse, as the CMPn output signal. In the event the fusible link F400 is intact, the COLn signal is coupled via transmission gate T402 to the output node 406. In the event the fusible link F400 is opened, the COLn_ signal is coupled via transmission gate T400 to the output node 406.

Advantageously, the preferred embodiment 300 includes only one fuse per column address bit, for a relatively small area requirement. At the same time, the preferred embodiment 300 does not suffer from timing disparities caused by standard NOR-type decoders having the same number of fuses.

While the preferred embodiment 300 can be utilized in a SDRAM, it is understood that the teachings set forth herein may be applied to other memory devices employing redundancy. Along these same lines, although the preferred embodiment 300 is utilized to enable column redundancy, the teachings set forth herein could be applied to other types of redundancy that require decoding. As just one example, some types of row redundancy could benefit from the aspects of the preferred embodiment.

Accordingly, it is understood that although one preferred embodiment has been described in detail, various changes, substitutions, and alterations could be made without departing from the spirit and scope of the invention as defined by the appended claims.

What is claimed is:

1. A redundancy circuit for use in a semiconductor memory device, comprising:

a decoder circuit having a plurality of compare devices coupled between a match node and a first common node, each compare device receiving a compare signal and providing a low impedance path between the match node and the first common node when its respective compare signal is active;

a mimic circuit having at least one mimic device coupled between an active mode node and a second common node, including at least a first mimic device that provides a low impedance path between the active operation node and the second common node;

a match indication circuit coupled to the match node, the match indication circuit providing a match indication signal and a no match indication signal according to the potential of the match node; and an interlock circuit for coupling the match indication and no match indication to a match output and no match output, respectively, according to the potential of the active operation mode.

2. The redundancy circuit of claim 1, wherein:
the first and second common node form a single node.

3. The redundancy circuit of claim 1, wherein:
each compare device of the decoder circuit includes an insulated gate field effect transistors (IGFET) having a source-drain path coupled between the match node and the first common node, and receiving a compare signal at its gate.

4. The redundancy circuit of claim 3, wherein:
each mimic device is an IGFET having a source-drain path coupled to the active operation node.

5. The redundancy circuit of claim 4, wherein:
the IGFET of each compare device has a first channel width; and
the IGFET of the first mimic device has a channel width equivalent to the first channel width.

6. The redundancy circuit of claim 5, wherein:
the mimic circuit further includes a second mimic device that includes an IGFET having a second channel width that is greater than the first channel width.

7. The redundancy circuit of claim 1, wherein:
the decoder circuit further includes an active enable device that receives an active operation signal and provides a low impedance path between the first common node and a first power supply voltage.

8. The redundancy circuit of claim 7, wherein:
the first common node is coupled to the second common node; and
the mimic circuit includes the first mimic device being enabled, and provides a low impedance path to the second common node, and a second mimic device which is always disabled, and provides a relatively high impedance path to the second common node.

9. The redundancy circuit of claim 1, wherein:
the decoder circuit places the match node at a no match potential when at least one of the compare devices provides a low impedance path between the match node and the first common node; and
the match indication circuit further includes a match pre-charge device for setting the match node to a match potential, the match indication circuit activating the match signal when the match node is at the match potential, and activating the no match signal when the match node is at the no match potential.

10. The redundancy circuit of claim 1, wherein:
the interlock circuit includes an interlock control circuit having an interlock pre-charge device for setting the active operation node to a disable potential, and an interlock enable circuit including
a match signal path coupled between the match indication circuit and a match output node, the match signal path being enabled when the active operation node is at the enable potential, and being disabled when the active operation node is at the disable potential, and
a no match signal path coupled between the match indication circuit and a no match output node, the no match signal path being enabled when the active operation node is at the enable potential, and being disabled when the active operation node is at the disable potential.

11. The redundancy circuit of claim 1, further including:
a fuse compare circuit including
a plurality of fusible links for establishing a defective address having a plurality of defective address values, and
a compare circuit associated with each fusible link, each compare circuit receiving a defective address value and an applied address value and generating a compare signal.

12. In a semiconductor memory device, a timing circuit for accessing standard and redundant memory cells, the timing circuit comprising:

a match indication circuit that generates a match indication in response to a pre-charge signal and generates a no match indication in response to a no match indication;

an interlock circuit including
a no match interlock gate that couples a no match indication to a no match output node, the no match interlock gate being enabled by an active interlock enable signal, and
a match interlock gate that couples a match indication to a match output node, the match interlock gate being enabled by the active interlock enable signal;

a decoder circuit that receives a plurality of compare signals, the decoder circuit generating a no match indication after a determination delay when at least one of the compare signals is active, the determination delay varying according to the number of active compare signals and including a worst case delay; and an interlock control circuit that generates the active interlock enable signal in response to an active indication; and a mimic circuit that receives an active operation signal, the mimic circuit generating an active indication after a mimic delay, the mimic delay being generally equivalent to the worst case delay.

13. The timing circuit of claim 12, wherein:
the match indication circuit includes a match pre-charge insulated gate field effect transistor (IGFET) having a source-drain path coupled between a first power supply voltage and an indication node, and a gate that receives a pre-charge signal, the match pre-charge IGFET coupling the indication node to the first power supply voltage to generate the match indication.

14. The timing circuit of claim 13, wherein:
the match indication circuit further includes a match feedback inverter having an input coupled to the indication node, and a match feedback IGFET having a source-drain path coupled between the first power supply voltage and the indication node, the gate of the match feedback IGFET being coupled to the output of the match feedback inverter.

15. The timing circuit of claim 12, wherein:

the interlock control circuit includes an interlock pre-charge IGFET having a source-drain path coupled between a first power supply voltage and an active operation node, and a gate that receives a pre-charge signal, the interlock pre-charge IGFET coupling the active operation node to the first power supply voltage to generate an inactive interlock enable signal.

16. The timing circuit of claim 15, wherein:

the interlock control circuit further includes an interlock feedback inverter having an input coupled to the active operation node, and an interlock feedback IGFET having a source-drain path coupled between the first power supply voltage and the active operation node, the gate of the interlock feedback IGFET being coupled to the output of the interlock feedback inverter.

17. The timing circuit of claim 12, wherein:

the decoder circuit includes a plurality of compare IGFETs having source-drain paths coupled between an indication node and a second power supply, the gate of each compare IGFET receiving one of the compare signals, the decoder circuit coupling the indication node to the second power supply voltage via at least one of the compare IGFETs to generate the no match indication, the worst case delay resulting when only one of the compare IGFETs is enabled.

18. The timing circuit of claim 17, wherein:

the compare IGFETs have channels of a generally uniform size; and the mimic circuit includes a mimic on IGFET having a source-drain path coupled between an active operation node and the second power supply voltage, the mimic on IGFET having a channel size equivalent to at least one of the compare IGFETs, the mimic circuit coupling the active operation node to the second power supply voltage via the mimic on IGFET to generate the active indication.

19. The timing circuit of claim 17, wherein:

the mimic circuit further includes a mimic off IGFET having a source-drain path coupled between an active operation node and the second power supply voltage, the mimic off IGFET having a channel size that is greater than that of any of the compare IGFETs.

20. The timing circuit of claim 12, further including:

a fuse/compare circuit having
a plurality of fusible links, each fusible link corresponding to an undecoded address bit and providing a programmable defective address bit, and
a compare circuit for comparing each programmed defective address bit value with an applied address bit value, and generating a compare signal therefrom.

21. The timing circuit of claim 20, wherein:

the fuse/compare circuit further includes a plurality of bit comparison circuits, each bit comparison circuit receiving a programmable defective address bit value and an applied address bit value, each compare circuit including
an applied address bit inverter for generating an inverse address bit value,
a first gate for coupling the applied address bit value to an output node, the first gate being enabled when the programmable address bit is a first value, and
a second gate for coupling the inverse of the applied address bit value to the output node, the second gate being enabled when the programmable address bit is a second value.

22. In a semiconductor memory device, a method of timing redundant and standard accesses, comprising the steps of:

comparing a defective address with an applied address;

making a match determination in the event the defective address matches the applied address;

activating a match signal in response to a match determination;

making a no match determination in the event the defective address does not match the applied address, the speed at which the no match determination is made varying according to the values of the defective address and the applied address, the slowest speed at which the no match determination is made being a worst case speed;

activating a no match signal in response to a no match determination;

making an active operation determination in response to an active operation signal, the speed at which the active operation determination is made mimicking the worst case speed of a no match determination;

activating an enable signal in response to an active operation determination;

coupling the match signal to a match output node in response to an active enable signal; and coupling the no match indication to a no match output in response to an active enable signal.

23. The redundancy scheme of claim 22, wherein:

the step of comparing a defective address with an applied address includes providing a plurality of fusible links that can be opened or kept intact depending upon the values of a defective address.

24. The redundancy scheme of claim 22, wherein:

the step of comparing a defective address with an applied address includes providing an undecoded applied address, and providing a fusible link corresponding to each bit of the undecoded applied address.

25. The redundancy scheme of claim 22, wherein:

the step of making a match determination includes comparing each bit of the defective address with a corresponding bit of an applied address, and generating a compare signal in response thereto.

26. The redundancy scheme of claim 25, wherein:

the step of making a match determination further includes pre-charging an indication node, and maintaining the indication node at the pre-charge potential.

27. The redundancy scheme of claim 26, wherein:

the step of making a no match determination includes pre-charging the indication node, and subsequently discharging the indication node in response to an active compare signal and an active operation signal.

28. The redundancy scheme of claim 27, wherein:

the step of making an active operation determination includes pre-charging an active operation node, and subsequently discharging the active operation node in response to an active operation signal.

* * * * *